(12) United States Patent
Kwok et al.

(10) Patent No.: US 8,433,985 B2
(45) Date of Patent: Apr. 30, 2013

(54) ERROR CORRECTION MECHANISMS FOR FLASH MEMORIES

(75) Inventors: Zion S. Kwok, Vancouver (CA); Chun Fung Kitter Man, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 501 days.

(21) Appl. No.: 12/748,746

(22) Filed: Mar. 29, 2010

(65) Prior Publication Data

US 2011/0239094 A1 Sep. 29, 2011

(51) Int. Cl.
*H03M 13/00* (2006.01)

(52) U.S. Cl.
USPC ........... 714/785; 714/752; 714/781; 714/782; 714/784

(58) Field of Classification Search .................. 714/752, 714/781, 782, 784, 785
See application file for complete search history.

(56) References Cited

U.S. PATENT DOCUMENTS

| | | | | |
|---|---|---|---|---|
| 6,119,262 A * | 9/2000 | Chang et al. | ........... | 714/781 |
| 6,122,766 A * | 9/2000 | Fukuoka et al. | ........... | 714/784 |
| 6,209,115 B1 * | 3/2001 | Truong et al. | ........... | 714/784 |
| 6,317,858 B1 * | 11/2001 | Cameron | ........... | 714/785 |
| 6,347,389 B1 * | 2/2002 | Boyer | ........... | 714/784 |
| 6,360,348 B1 * | 3/2002 | Yang | ........... | 714/784 |
| 6,539,516 B2 * | 3/2003 | Cameron | ........... | 714/785 |
| 6,694,476 B1 * | 2/2004 | Sridharan et al. | ........... | 714/781 |
| 7,010,739 B1 | 3/2006 | Feng et al. | | |
| 7,051,267 B1 | 5/2006 | Yu et al. | | |
| 7,096,408 B1 * | 8/2006 | Ireland et al. | ........... | 714/784 |
| 7,206,992 B2 * | 4/2007 | Xin | ........... | 714/782 |
| 7,206,993 B2 * | 4/2007 | Senda et al. | ........... | 714/784 |
| 7,249,310 B1 * | 7/2007 | Feng et al. | ........... | 714/784 |
| 7,322,004 B1 * | 1/2008 | Yu et al. | ........... | 714/784 |
| 7,421,642 B2 * | 9/2008 | Williamson et al. | ........... | 714/785 |
| 7,509,564 B2 * | 3/2009 | Dohmen et al. | ........... | 714/782 |
| 7,613,988 B1 | 11/2009 | Wu et al. | | |
| 7,721,185 B1 * | 5/2010 | Feng | ........... | 714/784 |
| 7,774,688 B1 * | 8/2010 | Teng et al. | ........... | 714/782 |
| 7,788,570 B1 * | 8/2010 | Feng | ........... | 714/784 |
| 7,865,809 B1 * | 1/2011 | Lee et al. | ........... | 714/782 |
| 8,086,941 B2 * | 12/2011 | Williamson et al. | ........... | 714/785 |
| 8,225,185 B1 * | 7/2012 | Tang et al. | ........... | 714/784 |
| 2003/0101406 A1 * | 5/2003 | Song | ........... | 714/774 |
| 2009/0150754 A1 * | 6/2009 | Dohmen et al. | ........... | 714/785 |
| 2010/0199156 A1 * | 8/2010 | Yang | ........... | 714/785 |
| 2011/0004812 A1 * | 1/2011 | Yang | ........... | 714/782 |

OTHER PUBLICATIONS

Gulliver, Matching Q-ary Reed—Solomon Codes with M-ary Modulation, Nov. 1997, IEEE, vol. 45, No. 11, pp. 1349-1353.*
Guo et al., Low-Complexity Architecture of RS Decoder for CMMB System, Oct. 20, 2009, IEEE, pp. 1003-1006.*

(Continued)

*Primary Examiner* — John J Tabone, Jr.
(74) *Attorney, Agent, or Firm* — Blakely, Sokoloff, Taylor & Zafman LLP

(57) ABSTRACT

Methods and apparatuses for Bose-Chaudhuri-Hocquenghem (BCH) decoding utilizing Berlekamp-Massey Algorithm (BMA) and Chien Search. The BMA may utilize one or more of a scalable semi-parallel shared multiplier array, a conditional q-ary inversionless BMA and/or a conditional binary Inversionless BMA. The Chien Search may be accomplished utilizing a non-rectangular multiplier array.

23 Claims, 7 Drawing Sheets

OTHER PUBLICATIONS

Liu et al., Low-Power High-Throughput BCH Error Correction VLSI Design for Multi-Level Cell NAND Flash Memories, May 11, 2006, IEEE, pp. 1-6.*

Gomes et al., Scalable and Parallel Codec Architectures for the DVB-S2 FEC System, 2008, IEEE, pp. 1506-1509.*

Search and Examination Report for United Kingdom Patent Application No. 1105014.3 mailed Jul. 20, 2011, 10 pgs.

Burton, Herbert O., "Inversionless Decoding of Binary BCH Codes", IEEE Trans. Inform. Theory, IT-17: 464-66, Jul. 1971.

Chang, Hsie-Chia, et al., "New Serial Architecture for the Berlekamp-Massey Algorithm", IEEE Trans. on Communications, 47: 441-483, 1999.

Chen, C. L., "High-Speed Decoding of BCH Codes", IEEE Trans. Inform. Theory, IT-27(2): 254-56, Mar. 1981.

Notice of Preliminary Rejection for Korean Patent Application No. 10-2011-28264 mailed Jul. 20, 2012, 4 pgs.

Translation of Abstract for Korean Patent No. 1020060098268, published Sep. 18, 2006, 1 pg.

* cited by examiner

ERROR CORRECTION MECHANISMS FOR FLASH MEMORIES

TECHNICAL FIELD

Embodiments of the invention relate to error correction mechanisms. More particularly, embodiments of the invention relate to error correction mechanisms for use in flash memories (e.g., BCH codes).

BACKGROUND

Flash memory controller, particularly NAND flash, designs are placing higher throughput demands on Bose-Chaudhuri-Hocquenghem (BCH) decoder designs with limited hardware resources. The primary function of the BCH decoder is to detect and correct bit errors in a received codeword.

The BCH decoding process has four major steps. The first step is to calculate a syndrome from the received codeword. The second step is to take the syndrome and calculate the error locator polynomial, $\sigma(x)$. This second step is typically performed using the Berlekamp-Massey Algorithm (BMA). The third step is to find the roots of $\sigma(x)$, which correspond to bit error locations in the received codeword. This third step is typically performed using the Chien Search algorithm. The fourth step is to correct the bits that have been identified as errors.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

The Berlekamp-Massey Algorithm (BMA) is an iterative method of finding the error locator polynomial, $\sigma(x)$, that corresponds to a syndrome. Because the BMA is performing algebraic manipulation of polynomials, most of the arithmetic involves adding and multiplying the coefficients of the error locator polynomial, $\sigma(x)$, and an auxiliary polynomial, $\tau(x)$, as well as some scalar variables. Given the iterative nature of the BMA, the values of these polynomials and scalar variables will be updated for each iteration. The notation $\sigma^{(i)}(x)$ and $\tau^{(i)}(x)$ are used below to denote the values of $\sigma(x)$ and $\tau(x)$ in the $i^{th}$ teration. The variables are listed below.

x: algebraic variable
i: iteration count
t: number of correctable bit errors
S: syndrome
$S_i$: partial syndrome i
$\sigma(x)$: error locator polynomial
$\sigma^{(i)}(x)$: $\sigma(x)$ in the $i^{th}$ iteration
$\sigma_k^{(i)}$: coefficient $x^k$ $\sigma^{(i)}(x)$
v(i): degree of $\sigma^{(i)}(x)$
$\tau(x)$: auxiliary polynomial
$\Delta$: current discrepancy
$\Delta^{(i)}$: current discrepancy in the $i^{th}$ iteration $\delta$: previous discrepancy
D: auxiliary degree In the BMA, $\sigma^{(i+1)}(x)$ is computed as the sum of $\sigma^{(i)}(x)$ and $x\,\tau^{(i)}(x)$ multiplied by a scalar variable, $\Delta^{(i)}$, and divided by a scalar variable, $\delta$. The BMA requires a Galois field inversion operation, which is expensive in terms of both gate count and time.

$$\sigma^{(i+1)}(x) = \sigma^{(i)}(x) + \frac{\Delta^{(i)}}{\delta} x\tau^{(i)}(x) \qquad \text{Eq. (1)}$$

Therefore, an Inversionless BMA may be preferred. The Inversionless BMA removes the division operation, by multiplying by $\delta$. So the value of $\sigma^{(i+1)}(x)$ is computed as $\delta\sigma^{(i)}(x)+\Delta^{(i)}x\,\tau^{(i)}(x)$.

$$\sigma^{(i+1)}(x)=\delta\sigma^{(i)}(x)+\Delta^{(i)}x\tau^{(i)}(x) \qquad \text{Eq. (2)}$$

However, this value of $\sigma^{(i+1)}(x)$ is scaled by a $\delta$ when compared with the value of $\sigma^{(i+1)}x)$ in the original BMA. This is acceptable because the roots of $\sigma^{(i+1)}(x)$, which determine the bit error locations, are the same as the roots of $\delta\sigma^{(i+1)}(x)$. The other variables, $\tau^{(i+1)}(x)$ and $\Delta$, need to be multiplied by $\delta$ to preserve the correct interrelationship between the variables.

Figure 1:
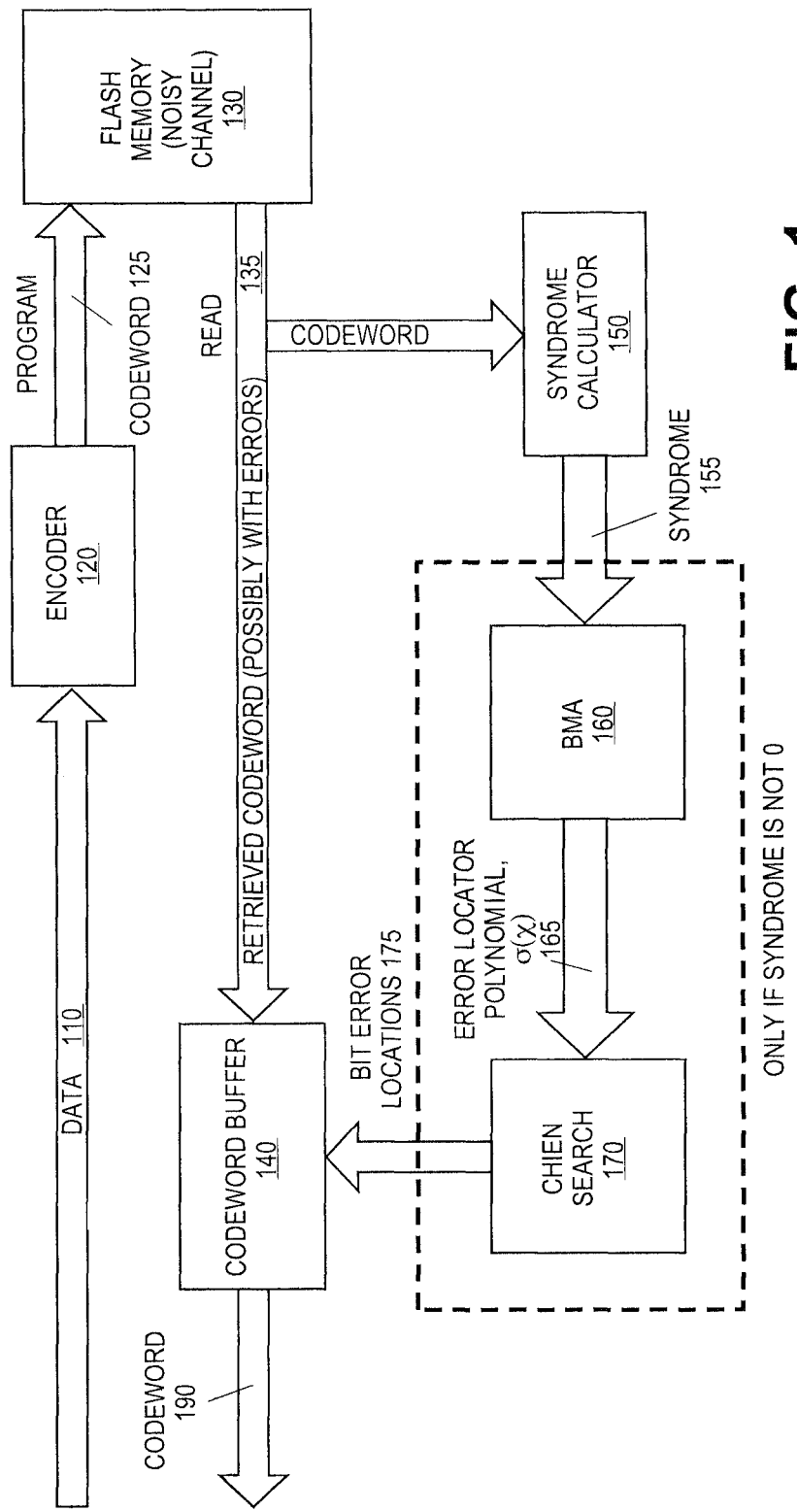
FIG. 1 is a block diagram of one embodiment of a Bose-Chaudhuri-Hocquenghem (BCH) encoding and decoding process.

FIG. 1 is a block diagram of one embodiment of a Bose-Chaudhuri-Hocquenghem (BCH) encoding and decoding process. Data 110 is supplied to encoder 120 to be encoded using BCH encoding algorithms. BCH encoding by encoder 120 may be accomplished in any manner known in the art. Encoder generates codeword 125, which is a BCH-encoded version of data 110. In many cases, codeword 125 consists of the concatenation of data 110 and parity.

Codeword 125 is stored in channel 130. In one embodiment, channel 130 is a NAND flash memory. In alternate embodiments, channel 130 may be other storage media, for example, NOR flash memory, dynamic random access memory (DRAM), a register, a rotating magnetic or optical disc, etc. Channel 130 may also be a communications link, for example, a wire, satellite communications, wireless radio communications, etc.

At some later time, the codeword is requested from channel 130. In response channel 130 provides retrieved codeword 135. Retrieved codeword 135 may be the same as codeword 125 if no errors have occurred. However, if an error has occurred within channel 130, retrieved codeword 135 includes one or more bit errors. Whether or not an error has occurred, retrieved codeword 135 is stored in codeword buffer 140.

Retrieved codeword 135 is provided to syndrome calculator 150. Syndrome calculator 150 operates on retrieved codeword 135 to generate syndrome 155, which indicates whether an error is detected in retrieved codeword 135. Syndrome 155 may be calculated by syndrome calculator 150 utilizing any technique known in the art. In one embodiment, a syndrome value of zero indicates no error in retrieved codeword 135. A non-zero syndrome value indicates the presence of an error in retrieved codeword 135.

Syndrome 155 is used by BMA calculator 160 to generate error locator polynomial, $\sigma(x)$, 165. In one embodiment, error locator polynomial 165 is generated as described below utilizing one or more of a scalable semi-parallel shared BMA multiplier architecture, a conditional q-ary Inversionless BMA operation and/or a conditional binary Inversionless BMA operation. The scalable semi-parallel shared BMA multiplier architecture, conditional q-ary Inversionless BMA operation and conditional binary Inversionless BMA operation are described in greater detail below.

Error locator polynomial 165 is utilized by Chien Search circuitry 170 to generate bit error locations 175. Various embodiments for Chien Search circuitry 170 are described in greater detail below. Bit error locations 175 are utilized by codeword buffer 140 to correct errors, if any, in retrieved codeword 135. After correction, if necessary, codeword buffer 140 provides codeword 190 as an output signal. In one embodiment, one or more of the components described with respect to FIG. 1 are included in a NAND flash memory controller.

In one embodiment, for binary BCH codes, every second iteration of the BMA can also be skipped. There is an Inversionless BMA for Binary BCH decoding and an Inversionless BMA for q-ary BCH decoding (e.g., Reed-Solomon). These may be referred to as Binary Inversionless BMA and q-ary Inversionless BMA, respectively.

To implement Binary or q-ary Inversionless BMA, there are three known architectures for positioning the Galois field multipliers. First, the serial multiplier architecture uses one multiplier to perform all the multiplications in the algorithm. Second, the parallel multiplier architecture uses a large number of multipliers to perform all the multiplications for one BMA iteration in one clock cycle. These two options are either optimized for minimum gate count or maximum throughput. However, it is often desirable to optimize for an intermediate throughput and gate count. A third architecture has three multipliers in which each multiplier performs multiplications between two fixed sets of operands.

Described herein are techniques for a modified processing of the BMA to achieve higher throughput for a given gate count. The modified processing of the BMA may be accomplished by application of: a) Scalable Semi-Parallel Shared BMA Multiplier Architecture, b) Conditional q-ary Inversionless BMA, and c) Conditional Binary Inversionless BMA.

The modifications to the BCH decoder that are described herein can be used, for example, to help NAND flash memory storage systems achieve high throughput speeds with a smaller gate count cost than would be incurred if a typical BCH decoder was scaled or replicated to meet high throughput requirements. The reduction in gate count cost can decrease the cost of the controller chip, the system cost, as well as the power consumption.

Lower power consumption is also important because the power budget of a solid state drive (SSD) or other non-volatile memory device may be tight. The modifications also make BCH with high correction strength feasible, because the gate count and associated power consumption of BMA at the same throughput scales by $O(t^3)$. Moreover, next generation NAND flash memory products with higher densities from smaller lithographies or packing more bits per cell will likely have higher raw bit error rates (RBER), and the development of these techniques are made more feasible by a lower BCH hardware cost in the controller. Finally, these improvements may also help to extend the life of a NAND flash memory product because the higher throughput speed will allow the device to maintain a nominal level of performance even as bit error rates rise due to cycling and retention.

In one embodiment, inversionless BMA may have three sets of Galois field multiplications that can be executed serially or in parallel for each iteration. The first set of multiplications is $\delta \times \sigma_0, \delta \times \sigma_1, \delta \times \sigma_2, \ldots, \delta \times \sigma_t$, where $\delta$ is a scalar variable, $\sigma_k$ represents the coefficient of the $k^{th}$ order term of $\sigma(x)$, and t is the number of correctable bit errors. The second set of multiplications is $\Delta \times \tau_0, \Delta \times \tau_1, \Delta \times \tau_2, \ldots, \Delta \times \tau_{t+2}$, where $\Delta$ is a scalar variable and $\tau_k$ represents the coefficient of the $k^{th}$ order term of $\tau(x)$. The third set of multiplications is $S_{i+3} \times \sigma_0, S_{i+2} \times \sigma_1, S_{i+1} \times \sigma_2, \ldots, S_{i-v(i)+3} \times \sigma_{v(i)}$, where $S_k$ represents the $k^{th}$ partial syndrome and v(i) is the degree of the polynomial, $\sigma(x)$.

The first and second sets of multiplications can be calculated in parallel, while the third set of multiplications depends on the results of the first two sets. This allows two multiplications per cycle. While the third set of multiplications depends on the results of the first and second sets, they can all be computed in the same clock cycle using one large combinational circuit. This increases the multiplications per cycle from two to three.

Each set of multiplications consists of approximately t+1 independent multiplications which can be, in one embodiment, computed in parallel. This increases the potential multiplications per cycle from three to approximately 3t+3. In short, the number of multipliers in an Inversionless BMA architecture can range from one, for a serial multiplier architecture, to 3t+3, for a fully parallel multiplier architecture.

Often a serial multiplier is too slow and a parallel multiplier architecture is too expensive in terms of gate count. The semi-parallel multiplier architectures take advantage of the parallelism between the different sets of multipliers and/or the parallelism between multiplications within each set, but do not use the full 3t+3 multipliers.

Given a small number of multipliers, computing multiplications within a single set in parallel results in the lowest latency for certain error distributions. As the number of multipliers increases, the reduction in average latency by adding more multipliers diminishes. Computing two or three sets of multiplications per cycle can result in lower average latency, but at the expense of having more multipliers.

Figure 2:
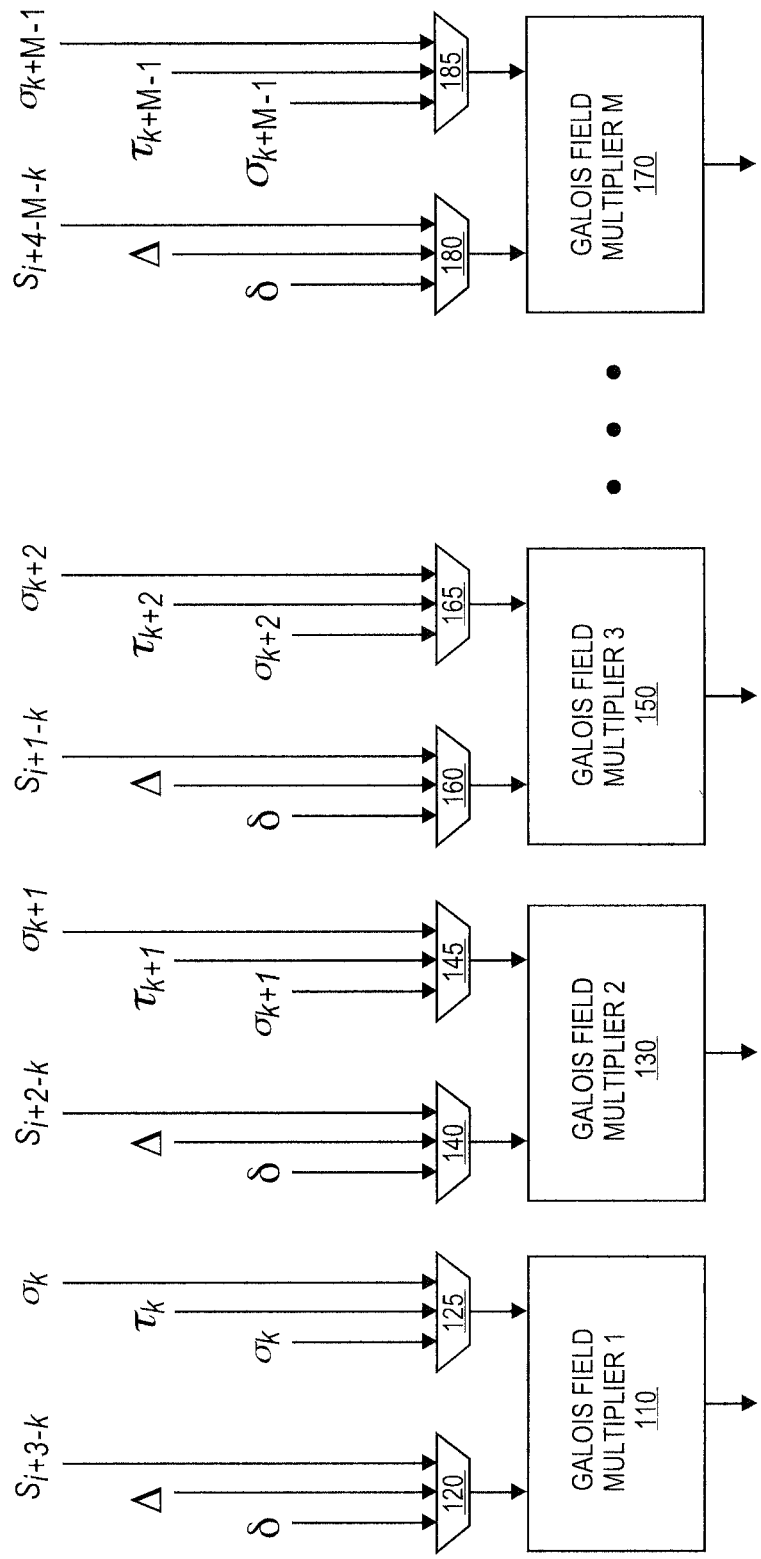
FIG. 2 is a conceptual diagram of one embodiment of a scalable semi-parallel shared BMA multiplier architecture.

FIG. 2 is a conceptual diagram of one embodiment of a scalable semi-parallel shared BMA multiplier architecture. In general, the multiplier architecture includes a plurality of multipliers with multiplexors providing input variables. The multiplexors are controlled by a state machine or other control device (not illustrated in FIG. 2) that can function to select the appropriate input values for the multipliers.

In one embodiment, the multiplier architecture includes an array of Galois field multipliers. Any number of multipliers can be supported. The example of FIG. 2 includes M multipliers (110, 130, 150 and 170). Each multiplier receives two values to multiply in order to generate a result value. In one embodiment, the input values for the multipliers are provided by multiplexors (120 and 125 for multiplier 110, 140 and 145 for multiplier 130, 160 and 165 for multiplier 150, and 180 and 185 for multiplier 170).

In one embodiment, one of the multiplexors for each multiplier receives input values corresponding to a previous discrepancy ($\delta$), a current discrepancy ($\Delta$), and a partial syndrome (e.g., $S_{i+3-k}$, $S_{i+2-k}$, $S_{i+1-k}$, ..., $S_{i+4-M-k}$). In one embodiment, the other multiplexor for each multiplier receives input values corresponding to a coefficient of $x^k$ in $\sigma(x)$ (e.g., $\sigma_k$, $\sigma_{k+1}$, $\sigma_{k+2}$, ..., $\sigma_{k+M-1}$), and a coefficient of $x^k$ in an auxiliary polynomial (e.g., $\tau_k$, $\tau_{k+1}$, $\tau_{k+2}$, ..., $\tau_{k+M-1}$). In one embodiment, the coefficient of $x^k$ in $\sigma(x)$ is also provided to a third input of the second multiplexor for simplicity of control of the multiplexors.

One example of the Scalable Semi-Parallel Shared BMA Multiplier Architecture uses one bank of Galois field multipliers to multiply coefficients in $\sigma(x)$ and $\tau(x)$, as well as partial syndromes. It can use the same bank of multipliers to perform each set of multiplications, hence the name, "Shared". In each clock cycle, coefficients from consecutive terms in $\sigma(x)$ or $\tau(x)$ may be loaded and multiplied with the discrepancy or with consecutive partial syndromes as a Single-Instruction Multiple-Data (SIMD) operation.

This architecture is scalable because it is possible to adjust the number of multipliers from one to t+1 (one more than the number of correctable bit errors), spanning the design space between slow serial multiplication and fast parallel multiplication to allow flexibility in trading off gate count and throughput.

In one embodiment, in the q-ary Inversionless BMA, when the value of $\Delta^{(i)}$ is 0, the equation to calculate $\sigma^{(i+1)}(x)$ is simplified to $\delta\sigma^{(i)}(x) + 0\tau^{(i)}(x) = \delta\sigma^{(i)}(x)$. In this case, there is no longer a need to multiply $\sigma(x)$ by $\delta$, because the roots of $\sigma^{(i)}(x)$ and $\delta\sigma^{(i)}(x)$ are the same. Therefore, whenever $\Delta^{(i)}$ is 0, the Conditional q-ary Inversionless BMA specifies $\sigma^{(i+1)}(x) = \sigma^{(i)}(x)$ instead of $\sigma^{(i+1)}(x) = \delta\sigma^{(i)}(x) + \Delta^{(i)}\tau^{(i)}(x)$. A significantly fewer number of multiplications are needed when compared to the q-ary Inversionless BMA.

One embodiment of a non-conditional q-ary Inversionless BMA may be described as:

```
δ = 1
Δ⁽⁰⁾ = S₁
σ⁽⁻¹⁾(x) = 1
τ⁽⁻¹⁾(x) = 1
D⁽⁻¹⁾ = 0
for (i = 0; i < 2t; i = i +1)
{
    σ⁽ⁱ⁾(x) = δσ⁽ⁱ⁻¹⁾(x) + Δ⁽ⁱ⁾xτ⁽ⁱ⁻¹⁾(x)
    v(i) = deg(σ⁽ⁱ⁾(x))
    Δ⁽ⁱ⁺¹⁾ = S_{i+2}σ₀⁽ⁱ⁾ + S_{i+1}σ₁⁽ⁱ⁾ + ... + S_{i-v(i)+2}σ_{v(i)}⁽ⁱ⁾
    if ((Δ⁽ⁱ⁾ = 0) or (2D⁽ⁱ⁻¹⁾ ≧ i + 1))
    {
        D⁽ⁱ⁾ = D⁽ⁱ⁻¹⁾
        τ⁽ⁱ⁾(x) = xτ⁽ⁱ⁻¹⁾(x)
    }
    else
    {
        D⁽ⁱ⁾ = i + 1 - D⁽ⁱ⁻¹⁾
        τ⁽ⁱ⁾(x) = σ⁽ⁱ⁻¹⁾(x)
        δ = Δ⁽ⁱ⁾
    }
    if ((i + 1) ≧ (t + v(i) - 1))
    {
        Exit
    }
}
```

One embodiment of a conditional q-ary Inversionless BMA may be described as:

```
δ = 1
Δ⁽⁰⁾ = S₁
σ⁽⁻¹⁾(x) = 1
τ⁽⁻¹⁾(x) = 1
D⁽⁻¹⁾ = 0
for (i = 0; i < 2t; i = i +1)
{
    if (Δ⁽ⁱ⁾ = 0)
    {
        σ⁽ⁱ⁾(x) = σ⁽ⁱ⁻¹⁾(x)
    }
    else
    {
        σ⁽ⁱ⁾(x) = δσ⁽ⁱ⁻¹⁾(x) + Δ⁽ⁱ⁾xτ⁽ⁱ⁻¹⁾(x)
    }
    v(i) = deg(σ⁽ⁱ⁾(x))
    Δ⁽ⁱ⁺¹⁾ = S_{i+2}σ₀⁽ⁱ⁾ + S_{i+1}σ₁⁽ⁱ⁾ + ... + S_{i-v(i)+2}σ_{v(i)}⁽ⁱ⁾
    if ((Δ⁽ⁱ⁾ = 0) or (2D⁽ⁱ⁻¹⁾ ≧ i + 1))
    {
        D⁽ⁱ⁾ = D⁽ⁱ⁻¹⁾
        τ⁽ⁱ⁾(x) = xτ⁽ⁱ⁻¹⁾(x)
    }
    else
    {
        D⁽ⁱ⁾ = i + 1 - D⁽ⁱ⁻¹⁾
        τ⁽ⁱ⁾(x) = σ⁽ⁱ⁻¹⁾(x)
        δ = Δ⁽ⁱ⁾
    }
    if ((i + 1) ≧ (t + v(i) - 1))
    {
        Exit
    }
}
```

Note that in the conditional q-ary Inversionless BMA if $\Delta^{(i)}=0$ then a simpler computation is used to determine $\sigma^{(i)}(x)$. This conditional operation may provide more efficient BMA computations, which may provide increased throughput.

In one embodiment, when $\Delta^{(i)}$ is 0, the Conditional Binary Inversionless BMA specifies $\sigma^{(i+1)}(x) = \sigma^{(i)}$ instead of $\sigma^{(i+1)}(x) = \delta\sigma^{(i)}(x) + \Delta^{(i)}\tau^{(i)}(x)$. The Conditional Binary Inversionless BMA also applies an optimization that applies to binary BCH: every second iteration is skipped.

One embodiment of a non-conditional binary Inversionless BMA may be described as:

```
δ = 1
Δ⁽⁰⁾ = S₁
σ⁽⁻²⁾(x) = 1
τ⁽⁻²⁾(x) = 1
D⁽⁻²⁾ = 0
for (i = 0; i < 2t; i = i + 2)
{
    σ⁽ⁱ⁾(x) = δσ⁽ⁱ⁻²⁾(x) + Δ⁽ⁱ⁾xτ⁽ⁱ⁻²⁾(x)
    v(i) = deg(σ⁽ⁱ⁾(x))
    Δ⁽ⁱ⁺²⁾ = S_{i+3}σ₀⁽ⁱ⁾ + S_{i+2}σ₁⁽ⁱ⁾ + ... + S_{i-v(i)+3}σ_{v(i)}⁽ⁱ⁾
    if ((Δ⁽ⁱ⁾ = 0) or (2D⁽ⁱ⁻²⁾ ≧ i + 1))
    {
        D⁽ⁱ⁾ = D⁽ⁱ⁻²⁾
        τ⁽ⁱ⁾(x) = xτ⁽ⁱ⁻²⁾(x)
    }
    else
    {
        D⁽ⁱ⁾ = i + 1 - D⁽ⁱ⁻²⁾
        τ⁽ⁱ⁾(x) = xσ⁽ⁱ⁻²⁾(x)
        δ = Δ⁽ⁱ⁾
    }
    if ((i + 1) ≧ (t + v(i) - 1))
    {
        Exit
    }
}
```

One embodiment of a conditional binary Inversionless BMA may be described as:

```
δ = 1
Δ⁽⁰⁾ = S₁
σ⁽⁻²⁾(x) = 1
τ⁽⁻²⁾(x) = 1
D⁽⁻²⁾ = 0
for (i = 0; i < 2t; i = i +2)
{
    If (Δ⁽ⁱ⁾ = 0)
    {
        σ⁽ⁱ⁾(x) = σ⁽ⁱ⁻²⁾(x)
    }
    else
    {
        σ⁽ⁱ⁾(x) = δσ⁽ⁱ⁻²⁾(x) + Δ⁽ⁱ⁾xτ⁽ⁱ⁻²⁾(x)
    }
    v(i) = deg(σ⁽ⁱ⁾(x))
    Δ⁽ⁱ⁺²⁾ = S_{i+3}σ₀⁽ⁱ⁾ + S_{i+2}σ₁⁽ⁱ⁾ + ... + S_{i-v(i)+3}σ_{v(i)}⁽ⁱ⁾
    if ((Δ⁽ⁱ⁾ = 0) or (2D⁽ⁱ⁻²⁾ ≧ i + 1))
    {
        D⁽ⁱ⁾ = D⁽ⁱ⁻²⁾
        τ⁽ⁱ⁾(x) = xτ⁽ⁱ⁻²⁾(x)
    }
    else
    {
        D⁽ⁱ⁾ = i + 1 - D⁽ⁱ⁻²⁾
        τ⁽ⁱ⁾(x) = xσ⁽ⁱ⁻²⁾(x)
        δ = Δ(i)
    }
    if ((i + 1)≧(t + v(i) - 1))
    {
        Exit
    }
}
```

Note that in the conditional Binary Inversionless BMA if $\Delta^{(i)}=0$ then a simpler computation is used to determine $\sigma^{(i)}(x)$. This conditional operation may provide more efficient BMA computations, which may provide increased throughput.

The BCH decoder as described above can be used to help NAND flash memory storage systems achieve high throughput speeds with a smaller gate count cost than would be incurred if a typical BCH decoder was scaled or replicated to meet high throughput requirements. The reduction in gate count cost lowers the cost of the controller chip, the system cost, as well as the power consumption. The lower power consumption is important because the power budget of an SSD is often an important design consideration.

The architecture described herein also provides BCH decoding with high correction strength that is feasible because the gate count and associated power consumption of BMA at the same throughput scales by $O(t^3)$. Moreover, next generation NAND flash memory products with higher densities from smaller lithographies or packing more bits per cell will have higher raw bit error rates (RBER), and the development of these products are made more feasible with a reduced BCH hardware cost in the controller. Finally, these improvements may also help to extend the life of a NAND flash memory product because the higher throughput speed will allow the device to maintain a nominal level of performance even as bit error rates rise due to cycling and retention.

Figure 3:
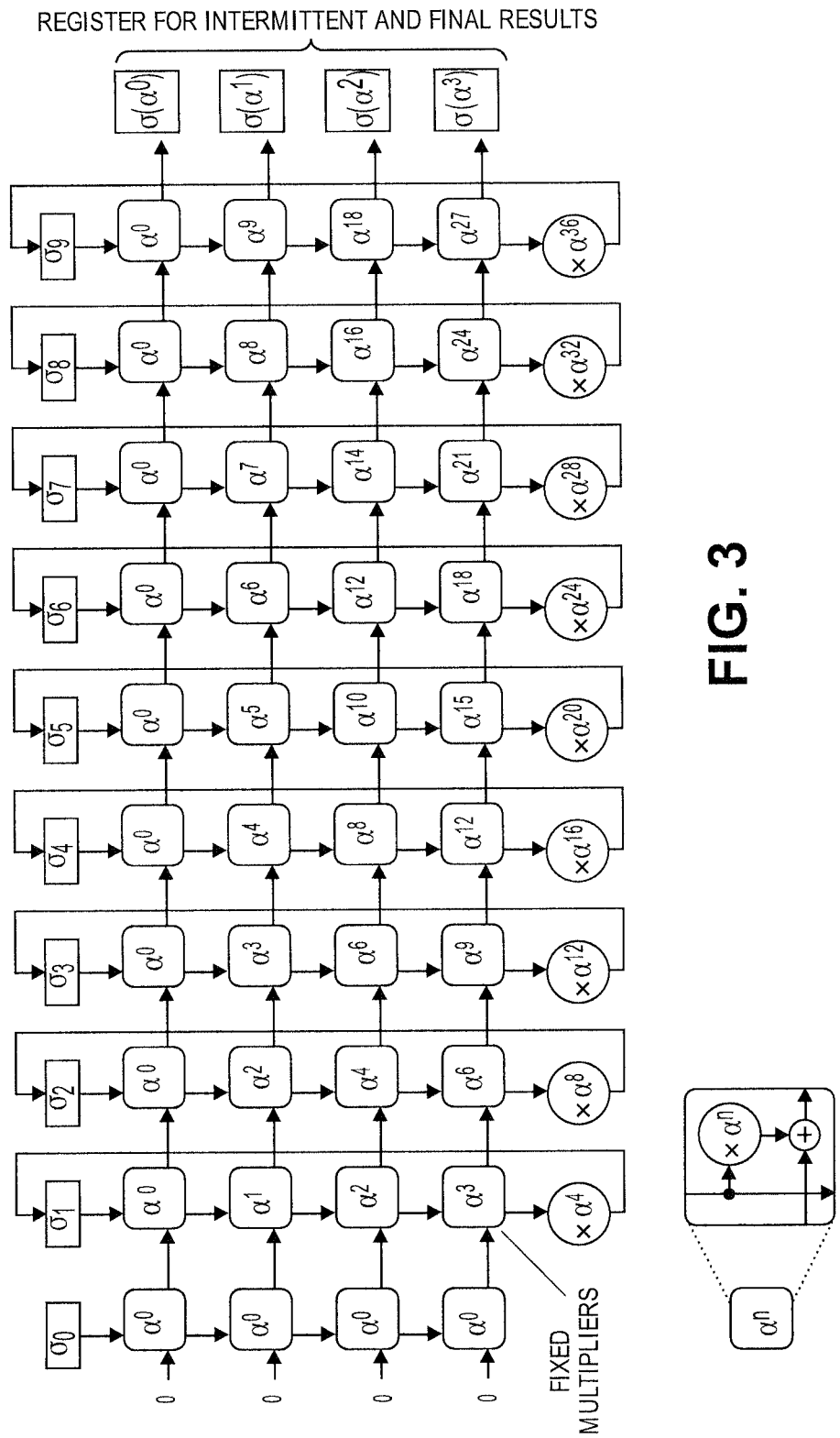
FIG. 3 is a conceptual diagram of one embodiment of a rectangular multiplier array that may be utilized by a Chien Search component.

FIG. 3 is a conceptual diagram of one embodiment of a rectangular multiplier array that may be utilized by a Chien Search component. One form of the Chien Search hardware uses the Rectangular Multiplier Array, in which one row of Galois field multipliers is used to multiply the coefficients of $\sigma(x)$ to search for the roots of $\sigma(x)$, which correspond to the bit error locations. The powers of alpha, $\alpha^n$, where n=0, 1, 2, etc., are elements in a Galois field. Each power of alpha is substituted into $\sigma(x)$ to see if $\sigma(\alpha^n)=0$. Thus, the Chien Search consists of Galois field multiplications by powers of alpha followed by Galois field addition to evaluate the polynomial.

To check several potential roots in parallel, more rows may be added in parallel to form a multiplier array. The number of rows is flexible while the number of columns is fixed and equal to the maximum correction strength of the BCH code because this configuration corresponds to the maximum power of x in $\sigma(x)$. The rectangular boxes at the top of FIG. 3 represent registers that hold the coefficients of $\sigma(x)$. These coefficients are updated each clock cycle by multiplying by the bottom row of multipliers. In the second clock cycle, the first row of multipliers calculates $\sigma(\alpha^0)$ again, but this time the coefficients of $\sigma(x)$ have changed, so the result of the calculation is actually $\sigma(\alpha^4)$. Similarly, the second row now calculates $\sigma(\alpha^5)$. In this way, the Chien Search can iterate until the value of $\sigma(\alpha^n)$ is calculated for all possible values of n.

Figure 4:
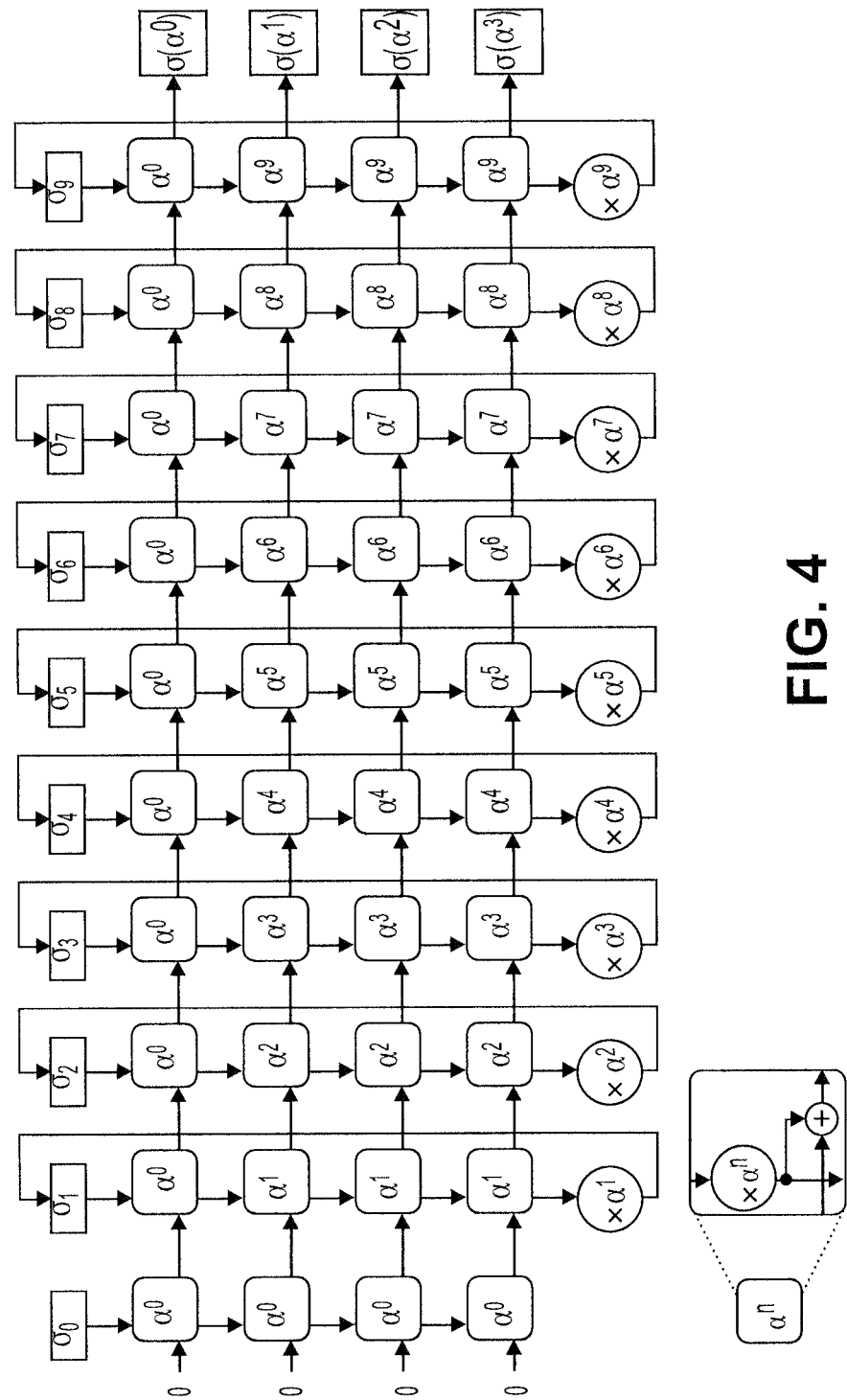
FIG. 4 is a conceptual illustration of one embodiment of a Ripple Cascade Multiplier Array that may be utilized by a Chien Search component.

FIG. 4 is a conceptual illustration of one embodiment of a Ripple Cascade Multiplier Array that may be utilized by a Chien Search component. The ripple cascade multiplier array is conceptually different from the rectangular multiplier array in that the multiplication factors are different and the products of each row of multipliers become the inputs to the row of multipliers below it, but they are functionally equivalent.

Figure 5:
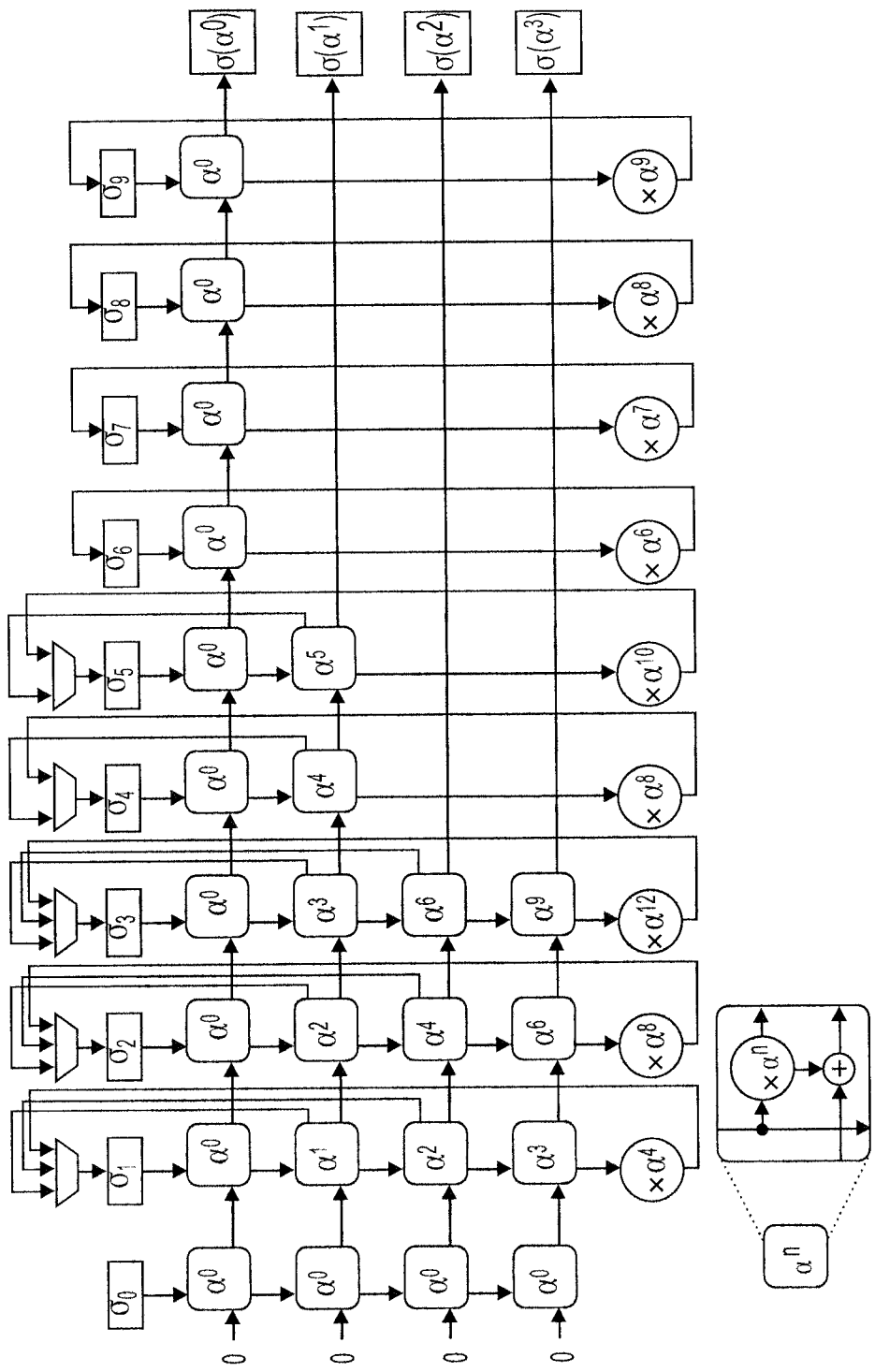
FIG. 5 is a conceptual illustration of one embodiment of an irregularly shaped variable-performance multiplier array that may be utilized by a Chien Search component.

FIG. 5 is a conceptual illustration of one embodiment of an irregularly shaped variable-performance multiplier array that may be utilized by a Chien Search component. The number of bit errors is equal to the number of roots of $\sigma(x)$, which equals the degree of $\sigma(x)$. In cases where the number of bit errors is smaller than t, the maximum number of correctable bit errors of the BCH hardware, many of the multipliers are unnecessary. It is possible provide more multipliers to provide higher parallelism for codewords with few bit errors, and thus higher throughput for these codewords compared to codewords with more bit errors.

Figure 6:
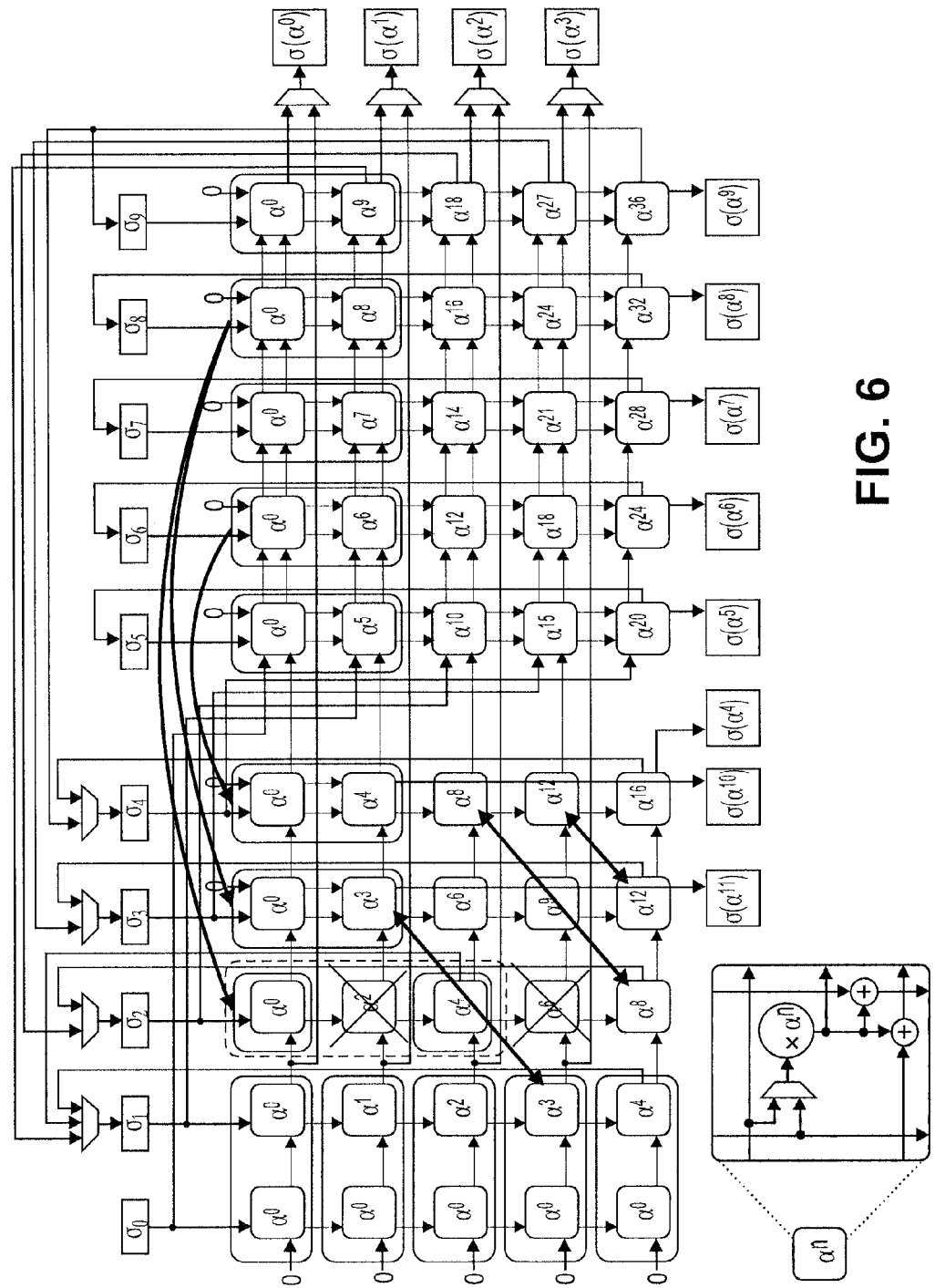
FIG. 6 is a conceptual illustration of one embodiment of a rectangular multiplier array with functional flexibility that may be utilized by a Chien Search component.

FIG. 6 is a conceptual illustration of one embodiment of a rectangular multiplier array with functional flexibility that may be utilized by a Chien Search component. One property of the Rectangular Multiplier Array is that the multipliers on the first row are equivalent to the multipliers in the first column, the multipliers on the second row are equivalent to the multipliers in the second column, and so on and so forth.

If the array is viewed as a matrix of multipliers, the matrix is similar to a symmetric matrix except that it is not square. Both rows and columns have geometric series of Galois field multipliers. However, the $k^{th}$ row of multipliers is not equivalent to the $k^{th}$ column of multipliers because they have different inputs. Even so, the inputs of the multipliers can be selected, so that the same multipliers can be reused for different calculations in the Chien Search.

Each multiplier multiplies by a constant power of $\alpha$ in a Galois field. The product of one multiplier can be fed as the input to another multiplier, so that there are two or more cascaded multiplications. This can be used to combine multipliers to multiply by other powers of a. In other words, $\alpha^x \times \alpha^y = \alpha^{x+y}$.

Furthermore, from each series of multipliers that includes $\alpha^0, \alpha^i, \alpha^{2i}, \alpha^{3i}, \alpha^{4i}, \ldots$, it is possible to select a subset of multipliers to generate another series $\alpha^0, \alpha^j, \alpha^{2j}, \alpha^{3j}, \alpha^{4j}, \ldots$, where j is a multiple of i. It is also possible to represent the series as $\alpha^0, \alpha^i, \alpha^{2i}, \ldots, \alpha^j, \alpha^{j+i}, \alpha^{j+2i}, \ldots, \alpha^{2j}, \alpha^{2j+i}, \alpha^{2j+2i}, \ldots$. FIG. 6 provides an example of using functional flexibility to calculate $\sigma(\alpha^n)$ for 12 values of n when the degree of $\sigma(x)$ is 1.

The geometric series can also be represented and calculated recursively. As an example, the Chien Search algorithm includes calculating a polynomial, $\sigma(x)$, where $x=\alpha^n$. The polynomial can be factored algebraically and recursively. For example:

$$\sigma(\alpha^n)=\sigma_0+\sigma_1\alpha^n+\sigma_2\alpha^{2n}+\sigma_3\alpha^{3n}+\sigma_4\alpha^{4n}+\sigma_5\alpha^{5n}+\sigma_6\alpha^{6n}+\sigma_7\alpha^{7n}+\sigma_8\alpha^{8n}+\sigma_9\alpha^{9n}+ \quad \text{Eq. (3)}$$

$$\sigma(\alpha^n)=\sigma_0+(\sigma_1\alpha^n+\sigma_2\alpha^{2n}+\sigma_3\alpha^{3n})+\alpha^{3n}[(\sigma_4\alpha^n+\sigma_5\alpha^{2n}+\sigma_6\alpha^{3n})+\alpha^{3n}\{(\sigma_7\alpha^n+\sigma_8\alpha^{2n}+\sigma_9\alpha^{3n})+\alpha^{3n}(\ldots)\}] \quad \text{Eq. (4)}$$

$$\sigma(\alpha^n)=(\sigma_0+\sigma_1\alpha_n+\sigma_2\alpha_{2n}+\sigma_3\alpha_{3n})+\alpha_{4n}[(\sigma_4+\sigma_5\alpha_n+\sigma_6\alpha_{2n})+\sigma_7\alpha^{3n})+\alpha^{4n}\{(\sigma_8+\sigma_9\alpha_n+ \ldots )+\alpha^{4n}(\ldots)\}] \quad \text{Eq. (5)}$$

Figure 7:
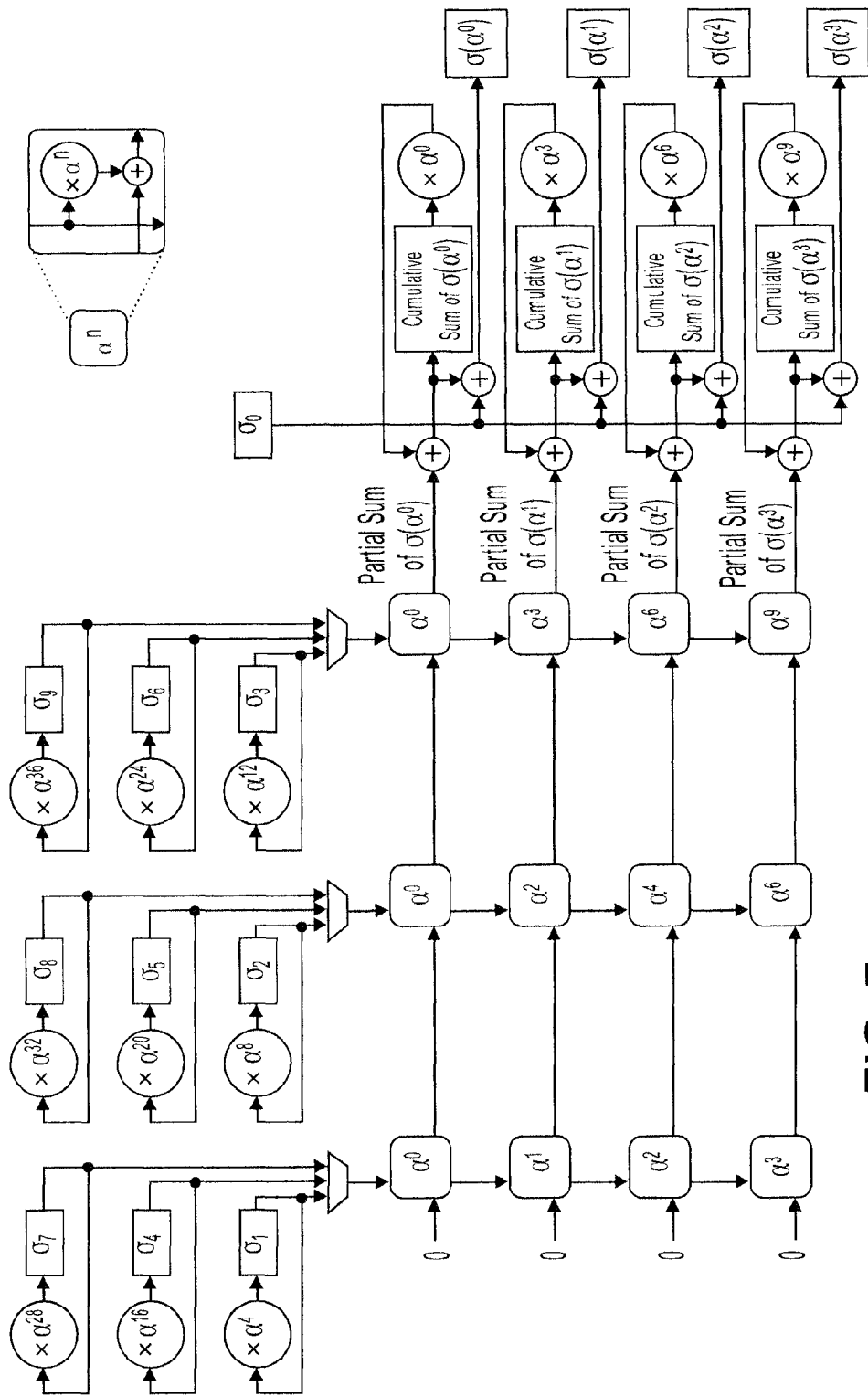
FIG. 7 is a conceptual illustration of one embodiment of a folding multiplier array that may be utilized by a Chien Search component.

Eq. 4 above is used in the folding multiplier array illustrated in FIG. 7.

In the recursive algebraic polynomial factoring discussed above, the same set multipliers can be reused to evaluate each level of recursion. In one embodiment, one level of recursion may be evaluated in each clock cycle, starting with the innermost factor. The folding multiplier array of FIG. 7 applies this concept. The number of clock cycles required to complete the computation is lower when the degree of $\sigma(x)$ is lower.

The techniques described herein enable Chien Search hardware to have a much higher throughput for low degree $\sigma(x)$ polynomials and lower throughput for high degree $\sigma(x)$ polynomials. This emphasis on handling the case of low degree $\sigma(x)$ polynomials increases the average throughput of Chien Search hardware because, in certain cases, most $\sigma(x)$ polynomials have a low degree.

The Chien Search techniques of the BCH decoder that are described herein can be used to help NAND flash memory storage systems achieve high throughput speeds with a smaller gate count cost than would be incurred if a typical BCH decoder was scaled or replicated to meet high throughput requirements. The reduction in gate count cost lowers the cost of the controller chip, the system cost, as well as the power consumption.

The non-rectangular multiplier architectures described herein may provide a more efficient method of implementing the Chien Search in hardware, which can be used to improve BCH decoding throughput with a limited gate count.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   receiving a syndrome corresponding to a codeword of data;
   indicating that there is no error in the codeword if the syndrome is zero;
   indicating an error in the codeword if the syndrome is non-zero;
   generating an error location polynomial for the codeword based on the syndrome utilizing at least a conditional Berlekamp-Massey Algorithm (BMA) by utilizing at least a configurable semi-parallel shared multiplier architecture, wherein the configurable semi-parallel shared multiplier architecture comprises a plurality of multiplier circuits receiving as a first input a selected one of a previous discrepancy, a current discrepancy value, and a partial syndrome value and receiving as a second input a selected one of an error locator polynomial coefficient value and an auxiliary polynomial coefficient value;
   analyzing the error location polynomial to determine bit error locations;
   correcting bit errors in the codeword as indicated by the bit error locations; and
   storing the codeword with the corrected bits.

2. The method of claim 1 wherein analyzing the error location polynomial to determine bit error locations comprises performing a Chien Search utilizing a non-rectangular multiplier array.

3. The method of claim 2 wherein the non-rectangular multiplier array comprises a rectangular multiplier array with functional flexibility.

4. The method of claim 2 wherein the non-rectangular multiplier array comprises a folding multiplier array.

5. The method of claim 1 wherein the BMA comprises at least computation of a conditional q-ary Inversionless BMA operation.

6. The method of claim 1 wherein the BMA comprises at least computation of a conditional binary Inversionless BMA operation.

7. A system comprising:
   a syndrome calculator coupled to receive a codeword from a memory device, the syndrome calculator to calculate a syndrome for the codeword, the syndrome to indicate whether the codeword includes an error;
   Berlekamp-Massey Algorithm (BMA) circuitry coupled to receive the syndrome, the BMA circuitry to generate an error locator polynomial corresponding to the syndrome, wherein the BMA circuitry performs at least one conditional operation based, at least in part on a current discrepancy value by utilizing at least a configurable semi-parallel shared multiplier architecture, wherein the configurable semi-parallel shared multiplier architecture comprises a plurality of multiplier circuits receiving as a first input a selected one of a previous discrepancy, a current discrepancy value, and a partial syndrome value and receiving as a second input a selected one of an error locator polynomial coefficient value and an auxiliary polynomial coefficient value;
   Chien Search circuitry coupled to receive the error locator polynomial, the Chien Search circuitry to generate bit error locations based on the error locator polynomial; and
   a codeword buffer to store the codeword, the codeword buffer coupled to receive the bit error locations and to correct errors in the codeword, if any, based at least on the bit error locations.

8. The system of claim 7 wherein the Chien Search circuitry utilizes a non-rectangular multiplier array.

9. The system of claim 8 wherein the non-rectangular multiplier array comprises a rectangular multiplier array with functional flexibility.

10. The system of claim 8 wherein the non-rectangular multiplier array comprises a folding multiplier array.

11. The system of claim 7 wherein the BMA circuitry performs at least computation of a conditional q-ary Inversionless BMA operation.

12. The system of claim 7 wherein the BMA circuitry performs at least computation of a conditional binary Inversionless BMA operation.

13. An apparatus comprising:

an encoder coupled to receive data to be stored, the encoder to generate a codeword based on the received data;

a storage device coupled with the encoder, the storage device to store the codeword;

a codeword buffer coupled to receive the codeword in response to the codeword being read from the storage device, the codeword buffer to store the codeword after it is read from the storage device;

a syndrome calculator coupled to the storage device to receive the codeword from the storage device, the syndrome calculator to calculate a syndrome for the codeword, the syndrome to indicate whether the codeword includes an error;

Berlekamp-Massey Algorithm (BMA) circuitry coupled to receive the syndrome, the BMA circuitry to generate an error locator polynomial corresponding to the syndrome, wherein the BMA circuitry performs at least one conditional operation based, at least in part on a current discrepancy value by utilizing at least a configurable semi-parallel shared multiplier architecture, wherein the configurable semi-parallel shared multiplier architecture comprises a plurality of multiplier circuits receiving as a first input a selected one of a previous discrepancy, a current discrepancy value, and a partial syndrome value and receiving as a second input a selected one of an error locator polynomial coefficient value and an auxiliary polynomial coefficient value;

Chien Search circuitry coupled to the BMA circuitry to receive the error locator polynomial, the Chien Search circuitry to generate bit error locations based on the error locator polynomial, the Chien Search circuitry also coupled with the codeword buffer to provide the bit error locations to the codeword buffer;

wherein the codeword buffer receives the bit error locations to correct errors in the codeword, if any, based at least on the bit error locations.

14. The apparatus of claim 13 wherein the Chien Search circuitry utilizes a non-rectangular multiplier array.

15. The apparatus of claim 14 wherein the non-rectangular multiplier array comprises a rectangular multiplier array with functional flexibility.

16. The apparatus of claim 14 wherein the non-rectangular multiplier array comprises a folding multiplier array.

17. The apparatus of claim 13 wherein the BMA circuitry performs at least computation of a conditional q-ary Inversionless BMA operation.

18. The apparatus of claim 13 wherein the BMA circuitry performs at least computation of a conditional binary Inversionless BMA operation.

19. A system comprising:

a syndrome calculator coupled to receive a codeword from a memory device, the syndrome calculator to calculate a syndrome for the codeword, the syndrome to indicate whether the codeword includes an error;

Berlekamp-Massey Algorithm (BMA) circuitry coupled to receive the syndrome, the BMA circuitry to generate an error locator polynomial corresponding to the syndrome, wherein the BMA circuitry performs at least one conditional operation based, at least in part on a current discrepancy value by utilizing at least a configurable semi-parallel shared multiplier architecture, wherein the configurable semi-parallel shared multiplier architecture comprises a plurality of multiplier circuits receiving as a first input a selected one of a previous discrepancy, a current discrepancy value, and a partial syndrome value and receiving as a second input a selected one of an error locator polynomial coefficient value and an auxiliary polynomial coefficient value;

Chien Search circuitry coupled to receive the error locator polynomial, the Chien Search circuitry to generate bit error locations based on the error locator polynomial, wherein the Chien Search circuitry utilizes a non-rectangular multiplier array; and a codeword buffer to store the codeword, the codeword buffer coupled to receive the bit error locations and to correct errors in the codeword, if any, based at least on the bit error locations.

20. The system of claim 19 wherein the non-rectangular multiplier array comprises a rectangular multiplier array with functional flexibility.

21. The system of claim 19 wherein the non-rectangular multiplier array comprises a folding multiplier array.

22. The system of claim 19 wherein the BMA circuitry performs at least computation of a conditional q-ary Inversionless BMA operation.

23. The system of claim 19 wherein the BMA circuitry performs at least computation of a conditional binary Inversionless BMA operation.

\* \* \* \* \*